United States Patent
Pickel et al.

(10) Patent No.: US 12,159,956 B2
(45) Date of Patent: Dec. 3, 2024

(54) OPTOELECTRONIC SEMICONDUCTOR CHIP AND METHOD FOR PRODUCING AN OPTOELECTRONIC SEMICONDUCTOR CHIP

(71) Applicant: OSRAM OLED GmbH, Regensburg (DE)

(72) Inventors: Sebastian Pickel, Regensburg (DE); Katharina Werner, Regensburg (DE); Bernd Böhm, Obertraubling (DE); Anna Strozecka-Assig, Regensburg (DE); Anna Nirschl, Regenstauf (DE)

(73) Assignee: OSRAM OLED GMBH, Regensburg (DE)

( * ) Notice: Subject to any disclaimer, the term of this patent is extended or adjusted under 35 U.S.C. 154(b) by 910 days.

(21) Appl. No.: 17/267,575

(22) PCT Filed: Aug. 13, 2019

(86) PCT No.: PCT/EP2019/071733
§ 371 (c)(1),
(2) Date: Mar. 30, 2021

(87) PCT Pub. No.: WO2020/035498
PCT Pub. Date: Feb. 20, 2020

(65) Prior Publication Data
US 2021/0320223 A1      Oct. 14, 2021

(30) Foreign Application Priority Data

Aug. 13, 2018 (DE) .......................... 102018119622.9

(51) Int. Cl.
*H01L 33/22*      (2010.01)
*H01L 33/00*      (2010.01)
(Continued)

(52) U.S. Cl.
CPC .......... *H01L 33/22* (2013.01); *H01L 33/0062* (2013.01); *H01L 33/30* (2013.01); *H01L 33/38* (2013.01); *H01L 2933/0016* (2013.01)

(58) Field of Classification Search
CPC ....................................................... H01L 33/22
See application file for complete search history.

(56) References Cited

U.S. PATENT DOCUMENTS

| 8,928,052 B2 | 1/2015 | Engl et al. |
| 2007/0018182 A1 | 1/2007 | Beeson et al. |

(Continued)

FOREIGN PATENT DOCUMENTS

| DE | 102007003282 A1 | 7/2008 |
| DE | 102008062932 A1 | 6/2010 |

(Continued)

*Primary Examiner* — Moazzam Hossain
*Assistant Examiner* — Hajar Kolahdouzan
(74) *Attorney, Agent, or Firm* — MH2 Technology Law Group LLP

(57) ABSTRACT

Provided is an optoelectronic semiconductor chip including a semiconductor layer sequence having an active layer, a doped current spreading layer and an output coupling layer, which are arranged one above the other in this order. The active layer generates primary radiation during intended operation. The current spreading layer includes a larger lateral electrical conductivity than the output coupling layer. The output coupling layer includes output coupling structures for coupling out radiation on an exit side facing away from the active layer. The output coupling layer includes a lower absorption coefficient for primary radiation than the current spreading layer.

15 Claims, 6 Drawing Sheets

(51) Int. Cl.
*H01L 33/30* (2010.01)
*H01L 33/38* (2010.01)

(56) References Cited

U.S. PATENT DOCUMENTS

| | | | |
|---|---|---|---|
| 2007/0018184 A1* | 1/2007 | Beeson | H01L 33/405 |
| | | | 257/E33.068 |
| 2012/0146044 A1* | 6/2012 | Gmeinwieser | H01L 33/22 |
| | | | 257/E33.023 |
| 2017/0345972 A1 | 11/2017 | Schellhammer et al. | |

FOREIGN PATENT DOCUMENTS

| | | |
|---|---|---|
| DE | 102014108373 A1 | 12/2015 |
| DE | 102016104965 A1 | 9/2017 |
| WO | 0141225 A2 | 6/2001 |
| WO | 2017178427 A1 | 10/2017 |

* cited by examiner

OPTOELECTRONIC SEMICONDUCTOR CHIP AND METHOD FOR PRODUCING AN OPTOELECTRONIC SEMICONDUCTOR CHIP

CROSS REFERENCE TO RELATED APPLICATIONS

This patent application is a national stage entry from International Application No. PCT/EP2019/071733, filed on Aug. 13, 2019, published as International Publication No. WO 2020/035498 A1 on Feb. 20, 2020, and claims priority under 35 U.S.C. § 119 from German patent application 10 2018 119 622.9, filed Aug. 13, 2018, the entire contents of all of which are incorporated by reference herein.

FIELD

An optoelectronic semiconductor chip is specified. Furthermore, a method for producing an optoelectronic semiconductor chip is specified.

BACKGROUND

A problem to be solved is to specify an optoelectronic semiconductor chip having a high radiation output coupling efficiency. Another task to be solved is to specify a method for producing such a semiconductor chip.

These tasks are solved, inter alia, by the objects of the independent patent claims. Advantageous embodiments and further designs are the subject matter of the dependent patent claims.

SUMMARY

According to at least one embodiment, the optoelectronic semiconductor chip comprises a semiconductor layer sequence with an active layer, a doped current spreading layer and an output coupling layer, which are arranged one above the other in this order. Preferably, the layers are epitaxially grown on top of each other in this order. Said layers may be directly adjacent to each other. Alternatively, further semiconductor layers may be arranged between said layers. Said layers are part of the semiconductor layer sequence and are thus semiconductor layers.

The semiconductor layer sequence is based, for example, on a III-V compound semiconductor material. In particular, said layers are then based on or consist of a III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, where $0 \leq n \leq 1$, $0 \leq m \leq 1$, and $m+n \leq 1$, respectively. Here, the semiconductor layer sequence may comprise dopants as well as additional components. For simplicity, however, only the essential constituents of the crystal lattice of the semiconductor layer sequence, i.e. Al, As, Ga, In, N or P, are specified, even if these may be partially replaced and/or supplemented by small amounts of additional substances. Preferably, the semiconductor layer sequence is based on $Al_nIn_{1-n-m}Ga_mP$.

The active layer generates primary electromagnetic radiation during intended operation. This occurs by recombination of electrons and holes in the region of the active layer. In particular, the active layer includes at least one pn junction and/or at least one quantum well structure and can, for example, generate electromagnetic primary radiation in the blue or green or red spectral range or in the UV range or in the IR range during intended operation. Preferably, the semiconductor chip comprises exactly one, connected, in particular simply connected, active layer. Alternatively, the active layer may also be segmented.

A semiconductor chip is understood here and in the following to be a separately manageable and electrically contactable element. A semiconductor chip is created in particular by separation from a wafer composite. In particular, side surfaces of such a semiconductor chip then comprise, for example, traces from the separation process of the wafer composite. A semiconductor chip preferably comprises exactly one originally contiguous region of the semiconductor layer sequence grown in the wafer composite. The semiconductor layer sequence of the semiconductor chip is preferably formed contiguously. The lateral extent of the semiconductor chip is, for example, at most 1% or at most 5% or at most 10% larger than the lateral extent of the active layer or the semiconductor layer sequence. The semiconductor chip still includes, for example, the growth substrate on which the entire semiconductor layer sequence is grown.

Lateral extent is understood here and in the following in particular as an extension or expansion in any lateral direction. A lateral direction is a direction parallel to the main extension plane of the active layer.

The semiconductor chip may be a so-called volume emitter, in particular a flip chip. In this case, the semiconductor chip preferably still comprises the growth substrate. Alternatively, the semiconductor chip may be a surface emitter, in particular a so-called thin film chip. In this case, the growth substrate is detached, for example. The growth substrate is based on GaAs, for example.

The current spreading layer and/or the output coupling layer can each comprise several partial layers. The partial layers then differ, for example, in terms of stoichiometric composition and/or doping. Lateral expansions of the current spreading layer and the output coupling layer are preferably at least 90% or at least 95% of the lateral expansion of the semiconductor chip.

According to at least one embodiment, the current spreading layer comprises a larger lateral electrical conductivity than the output coupling layer. For this purpose, the current spreading layer may be n-doped or p-doped. For example, doping of the current spreading layer is at least $5 \cdot 10^{17}$ cm$^{-3}$ or at least $1 \cdot 10^{18}$ cm$^{-3}$ or at least $5 \cdot 10^{18}$ cm$^{-3}$. The current spreading layer comprises, for example, at least ten times greater or at least 100 times or at least 1000 times greater electrical conductivity in the lateral direction than the output coupling layer. Te or Si, for example, is used as the dopant. The lateral conductivity is the conductivity in a lateral direction.

The doping of a layer is understood here and in the following in particular as the doping averaged over the entire volume of the respective layer.

The current spreading layer has, for example, an average thickness of at least 400 nm or at least 500 nm.

Alternatively or additionally, the average thickness of the current spreading layer is at most 4 μm or at most 3 μm or at most 2 μm. The thickness is measured perpendicular to the main extension plane of the active layer.

According to at least one embodiment, the output coupling layer comprises output coupling structures on an exit side facing away from the active layer for coupling out radiation. The output coupling structures are elevations, for example pyramid-like or cone-like or truncated pyramid-like or truncated cone-like or spherical segment-like elevations, of the output coupling layer. The output coupling structures are thus formed from the output coupling layer or are part of the output coupling layer.

The output coupling structures reduce the proportion of primary radiation that would otherwise be prevented from exiting via the exit side due to total reflection. The output coupling structures result in a redistribution of the primary radiation.

Preferably, at least 75% or at least 80% or at least 90% or at least 95% of the area of the exit side is structured. The remaining area of the exit side can be unstructured, in particular flat, within the manufacturing tolerance. The structured area, i.e. the area with the output coupling structures, is used for coupling out the primary radiation. The unstructured area can be used for contacting the semiconductor layer sequence.

The exit side is, for example, a cover side or a cover surface of the semiconductor layer sequence. The semiconductor layer sequence then closes with the exit side at least in some areas. In this case, no semiconductor material is arranged downstream of the exit side at least in the structured region and in a direction away from the active layer.

The output coupling layer comprises, for example, an average thickness of at least 200 nm or at least 500 nm. Alternatively or additionally, the average thickness of the output coupling layer may be at most 1.5 µm or at most 1.0 µm. A maximum thickness of the output coupling layer is, for example, at most 2.5 µm or at most 2 µm.

According to at least one embodiment, the output coupling layer comprises a lower absorption coefficient for the primary radiation than the current spreading layer. For example, the absorption coefficient of the output coupling layer is at most half or at most one third or at most one quarter or at most one tenth or at most 1/50 of the absorption coefficient of the current spreading layer.

The absorption coefficient is a measure of the reduction in intensity of electromagnetic radiation as it passes through a given material. Its dimension is 1/length. A large absorption coefficient means that the material relatively shields the radiation under consideration, while a smaller one means that it is more permeable to the radiation. In the term absorption coefficient, the term absorption is to be understood not only in the narrow sense of the transfer of radiation energy to the medium. Rather, scattering processes that merely deflect the radiation from its direction also contribute to the decrease in intensity (extinction) meant here.

The absorption coefficient of a layer is understood here as the absorption coefficient averaged over the entire volume of the respective layer. Furthermore, the absorption coefficient is preferably specified here for the wavelength at which the primary radiation comprises a global intensity maximum. In at least one embodiment, the optoelectronic semiconductor chip comprises a semiconductor layer sequence with an active layer, a doped current spreading layer and an output coupling layer, which are arranged one above the other in this order. The active layer generates primary radiation during intended operation. The current spreading layer comprises a larger lateral electrical conductivity than the output coupling layer. The output coupling layer comprises output coupling structures for coupling radiation out on an exit side facing away from the active layer. The output coupling layer comprises a lower absorption coefficient for primary radiation than the current spreading layer.

The present invention is based, inter alia, on the realization that for good radiation output coupling from one side of the semiconductor layer sequence, namely the exit side, the latter is often patterned or roughened. The order of magnitude of the thickness of the roughened semiconductor layer is several 100 nm. The patterned part of the semiconductor layer sequence is no longer available or only available to a limited extent, for example as a contact or for lateral current distribution.

One idea of the present invention is therefore to make the region with the output coupling structures as little absorbent as possible for the primary radiation, in particular less absorbent than the current spreading layer. For this purpose, use is made in the present case of an output coupling layer which differs from the current spreading layer and comprises a low absorption coefficient.

According to at least one embodiment, the exit side of the output coupling layer comprises a roughness of at least 200 nm or at least 500 nm or at least 700 nm or at least 1 µm. Alternatively or additionally, the roughness may be at most 1.7 µm or at most 1.5 µm.

The roughness of the exit side is due to the output coupling structures. The roughness is a measure of the variation in the surface height of the exit side produced by the output coupling structures. For example, only structures that produce a small variation in surface height are counted as roughness. For example, a "small variation" is a variation that is small compared to the lateral extent of the semiconductor chip, for example, at most 1/10 or at most 1/20 or at most 1/100 as large as the lateral extent of the semiconductor chip.

The roughness may be the average roughness. That is, the roughness specifies the average distance from a measurement point on the surface of the exit side to a center surface. The center surface intersects the real profile of the surface within a measuring region in such a way that the sum of the measured profile deviations, relative to the center surface, becomes minimal. Alternatively, however, the roughness can also be the square roughness, i.e. the mean square profile deviation from the center surface, or the maximum roughness, i.e. the maximum measured profile deviation from the center surface.

According to at least one embodiment, the output coupling layer comprises a lower defect density than the current spreading layer. For example, the defect density in the current spreading layer is at least twice as large or at least three times as large or at least four times as large or at least ten times as large as in the output coupling layer. The defect density is the defect density averaged over the entire volume of the respective layer. A low defect density generally results in a lower absorption of primary radiation.

The defect density can be adjusted, for example, as the layers grow. For example, the absorption layer can be grown at higher temperatures than the current spreading layer, reducing the defect density. Since the current spreading layer comprises a high doping and since a high doping often implies a lower growth temperature, the current spreading layer can generally only be grown with a relatively high defect density.

In turn, the defect density of a layer means the defect density averaged over the entire volume of the layer.

According to at least one embodiment, the band gap of the output coupling layer is larger than the energy of the primary radiation. In this context, the energy of the primary radiation is understood to be, in particular, the energy or wavelength at which the primary radiation has a global intensity maximum. For example, the band gap of the output coupling layer is at least 0.03 eV or at least 0.05 eV or at least 0.07 eV or at least 0.09 eV or at least 0.1 eV or at least 0.2 eV greater than the energy of the primary radiation. A high band gap of the output coupling layer further reduces the amount of absorbed primary radiation.

Again, the band gap of a layer is understood to be the band gap averaged over the entire volume of the layer. The band gap can be adjusted, for example, by the exact stoichiometric composition within the layers.

Alternatively or additionally, the band gap of the output coupling layer may be larger, for example by at least 0.03 eV or at least 0.05 eV or at least 0.07 eV or at least 0.09 eV or at least 0.1 eV or at least 0.2 eV larger than the band gap of the current spreading layer.

According to at least one embodiment, the semiconductor layer sequence is based on $Al_nIn_{1-n-m}Ga_mP$ with $0 \leq n \leq 1$, $0 \leq m \leq 1$ and $m+n \leq 1$. For example, the current spreading layer and/or the output coupling layer may be based on $Al_nIn_{1-n}P$, thus comprising a negligible Ga content.

According to at least one embodiment, the current spreading layer comprises a larger Ga content than the output coupling layer. For example, the Ga content in the current spreading layer is at least 200% or at least 300% or at least 500% of the Ga content in the output coupling layer. A higher Ga content increases the conductivity and reduces the band gap.

According to at least one embodiment, the optoelectronic semiconductor chip further comprises a contact element for injecting first charge carriers into the current spreading layer. For example, the contact element comprises or consists of metal. In particular, the contact element is formed of a material different from the semiconductor material of the semiconductor layer sequence.

The first charge carriers are electrons or holes. The first charge carriers are injected into the semiconductor layer sequence via the contact element. Thereby, the first charge carriers can be injected directly into the current spreading layer or indirectly by first injecting them into another semiconductor layer and from there into the current spreading layer.

The contact element can be arranged on the exit side. Then the output coupling layer is between the contact element and the current spreading layer. Alternatively, the contact element can extend from the exit side into the semiconductor layer sequence and open out into the semiconductor layer sequence in the region between the active layer and the exit side. Alternatively, the contact element can also extend through the active layer from the side of the semiconductor layer sequence opposite the exit side. In this case, the contact element is a so-called via.

If the contact element is arranged on the exit side, the exit side is preferably not structured in the region of the contact element, but is flat within the manufacturing tolerance. If the contact element extends from the exit side through the output coupling layer, the output coupling layer comprises a recess or hole in the region of the contact element. Outside this region, the exit side is structured. The region in which the contact element is arranged is also referred to here and in the following as the contact section of the semiconductor layer sequence. The region in which the output coupling layer is structured is also referred to here and in the following as the output coupling section of the semiconductor layer sequence.

At least in the contact section, the output coupling layer may be at least slightly doped to allow current conduction from the contact element through the output coupling layer to the current spreading layer.

According to at least one embodiment, the contact element comprises a bottom surface adjacent to the semiconductor material of the semiconductor layer sequence. The bottom surface preferably extends substantially parallel to the active layer. "Substantially" here means within manufacturing tolerance.

According to at least one embodiment, the semiconductor layer sequence comprises a doped contact layer which is thinner than the current spreading layer and comprises a higher doping than the current spreading layer.

For example, the doping of the contact layer is at least twice as large or at least five times as large or at least ten times as large as the doping of the current spreading layer. For example, the doping of the contact layer is at least $5 \cdot 10^{18}$ $cm^{-3}$ or at least $1 \cdot 10^{19}$ $cm^{-3}$. In particular, the contact layer comprises the same doping type as the current spreading layer. Thus, if the current spreading layer is n-doped, the contact layer is also n-doped.

For example, the average thickness of the contact layer is at most half or at most one-third or at most one-fourth or at most one-tenth of the average thickness of the current spreading layer. For example, the contact layer comprises an average thickness of at most 150 nm or at most 100 nm.

Alternatively or additionally, the average thickness of the contact layer may be at least 50 nm. For example, the contact layer is based on AlInGaP.

The contact layer may comprise a different stoichiometric composition than the layers adjacent to it. Alternatively, the contact layer may merely be a highly doped region in a layer and thus comprise the same stoichiometric composition as this layer.

According to at least one embodiment, the contact layer is adjacent to the bottom surface of the contact element. The contact layer reduces the contact resistance between the contact element and the semiconductor material of the semiconductor layer sequence.

According to at least one embodiment, the contact layer is arranged on the exit side of the output coupling layer and is adjacent to the exit side. That is, the contact layer is downstream of the exit side in the direction away from the active layer.

According to at least one embodiment, a lateral extent of the contact layer or an area of the contact layer substantially corresponds to the lateral extent or the area of the bottom surface of the contact element. For example, the lateral extent of the contact layer differs from the lateral extent of the bottom surface of the contact element by at most 30% or at most 20% or at most 10% or at most 5%. Viewed from above the exit side, for example, the area occupied by the contact element lies entirely within the area occupied by the contact layer. The contact layer is preferably confined to the contact section. In the region of the output coupling section, the semiconductor layer sequence is preferably free of the contact layer.

Alternatively, however, it is also possible that the lateral extent of the contact layer corresponds substantially, i.e. with a deviation of at most 20%, to the lateral extent of the active layer.

According to at least one embodiment, the lateral extent or the area of the bottom surface is at most 25% or at most 20% or at most 10% or at most 5% of the lateral extent or the area of the active layer.

The lateral extent is again understood as the extent along any direction parallel to the main extension plane of the active layer. The area of the active layer is the area that the active layer has when viewed from above the exit side.

According to at least one embodiment, the contact layer is arranged between the current spreading layer and the exit side and is adjacent to the current spreading layer. In this case, the contact element thus extends through the output coupling layer.

According to at least one embodiment, the bottom surface of the contact element directly adjoins the current spreading layer. In this case, in particular, a separate contact layer is dispensed with.

According to at least one embodiment, the output coupling layer comprises a lower doping than the current spreading layer. For example, the doping in the current spreading layer is at least ten times as large or at least 100 times as large or at least 1000 times as large as in the output coupling layer.

For example, the output coupling layer comprises a doping of at most $5 \cdot 10^{17}$ cm$^{-3}$ or at most $1 \cdot 10^{17}$ cm$^{-3}$ or at most $5 \cdot 10^{16}$ cm$^{-3}$. Alternatively or additionally, the doping of the output coupling layer can be at least $1 \cdot 10^{16}$ cm$^{-3}$. Preferably, the output coupling layer then comprises the same doping type as the current spreading layer.

According to at least one embodiment, the output coupling layer is nominally undoped. For example, a doping concentration in the output coupling layer is then at most $1 \cdot 10^{15}$ cm$^{-3}$ or at most $1 \cdot 10^{14}$ cm$^{-3}$.

Furthermore, a method for producing an optoelectronic semiconductor chip is specified. The method is particularly suitable for producing an optoelectronic semiconductor chip described herein. All features disclosed in connection with the optoelectronic semiconductor chip are therefore also disclosed for the method, and vice versa.

According to at least one embodiment, the method for producing an optoelectronic semiconductor chip comprises a step A) in which a semiconductor layer sequence comprising a doped contact layer, a less heavily doped output coupling layer and an active layer, which are arranged one above the other in this order, is provided. The active layer generates primary radiation during intended operation.

The specifications previously made for the semiconductor chip with respect to the active layer, the contact layer and the output coupling layer, in particular with respect to their doping concentrations and/or thicknesses, may also apply here. The contact layer is based on AlInGaP, for example. The fact that the output coupling layer is less heavily doped means here that it is less heavily doped than the contact layer.

The contact layer is preferably a cover layer of the semiconductor layer sequence. In the direction away from the active layer, therefore, no further semiconductor layer is arranged downstream of the contact layer.

According to at least one embodiment, the method comprises a step B) in which a photoresist layer is applied to the side of the contact layer facing away from the active layer, wherein the photoresist layer completely covers the contact layer both in an output coupling section and in a contact section of the semiconductor layer sequence.

The output coupling section and the contact section are laterally adjacent regions or sections of the semiconductor layer sequence. For example, as seen in a top view of the contact layer, the area of the contact section is at most 25% or at most 20% or at most 10% or at most 5% of the area of the output coupling section.

The photoresist layer completely covers both the area of the output coupling section and the area of the contact section. In particular, the photoresist layer is initially formed in a simply connected manner. A thickness of the photoresist layer is, for example, between 1 μm and 5 μm inclusive. For example, the photoresist layer is applied directly to the contact layer.

According to at least one embodiment, the method comprises a step C) in which the photoresist layer is patterned and partially removed in the region of the output coupling section. Preferably, islands of the photoresist layer remain. The islands are, for example, each simply connected and spaced apart from one another. The contact layer may be exposed between the islands. Structuring of the photoresist layer is carried out, for example, by lithography, for example with the aid of a mask.

The islands each have, for example, a diameter, measured in the lateral direction, between 0.1 μm and 2.5 μm inclusive. A distance between each two adjacent islands is, for example, between 0.1 μm and 10 μm inclusive. For example, at least 100 islands are generated from the photoresist layer in the output coupling section.

According to at least one embodiment, the method comprises a step D) in which an etching process is carried out. In this process, etching is carried out completely through the contact layer and into the output coupling layer in the regions of the output coupling section in which the photoresist layer has been removed, as a result of which output coupling structures are formed in the output coupling layer. The contact layer is removed in the region of the output coupling section. However, the photoresist layer is not penetrated in the region of the contact section.

Preferably, at least 90% or at least 95% or at least 99% or 100% of the contact layer in the output coupling section is removed in step D).

In regions of the output coupling section where the photoresist layer has been removed, the etchants used attack the semiconductor layer sequence and penetrate the first contact layer and penetrate into the output coupling layer. The output coupling layer is preferably not etched through completely. Due to the etching away of the semiconductor layer sequence in the region around the islands, output coupling structures are formed in the output coupling layer. The size of the output coupling structures is determined by the size of the islands and the type of etching process.

The etchants used in the etching process are preferably applied equally to the output coupling section and to the contact section. In particular, the photoresist layer and the etchants are selected so that the photoresist layer in the contact section is not completely penetrated. For example, the etching rate for the photoresist layer is lower than that for the semiconductor layer sequence.

Thus, after the etching process, the photoresist layer still completely covers the contact section. The fact that the photoresist layer is not penetrated in the region of the contact section means, in particular, that the etching process in step D) does not create holes in the photoresist layer in which the material below the photoresist layer is exposed and attacked by the etchants.

According to at least one embodiment, the method comprises a step E) in which the photoresist layer is removed in the region of the contact section. After removal of the photoresist layer, for example, the contact layer is exposed in the region of the contact section.

According to at least one embodiment, the method comprises a step F) in which a contact element is applied to the contact layer in the region of the contact section. In particular, the contact element is brought into direct contact with the exposed contact layer. The contact element is vapor-deposited, for example.

According to at least one embodiment, steps A) to F) are carried out in the order indicated and in succession.

According to at least one embodiment, in step D), a first etchant is first used to attack the material of the photoresist layer and to partially or completely remove the photoresist layer in the output coupling section. For example, the first etchant removes at least 90% or at least 95% or 100% of the photoresist layer in the output coupling section. If the photoresist layer in the output coupling section is not completely removed, a stripping process such as ashing, for example using an oxygen plasma, may be used after the use of the first etchant to remove the residual photoresist layer in the output coupling section.

Completely or nearly completely etching away the photoresist layer in the output coupling section generally does not result in completely etching away the photoresist layer in the contact section as well. This is because, due to the patterning in the photoresist layer and the resulting larger attack surface, the photoresist layer in the output coupling section is etched away more quickly than in the contact section.

For example, the first etchant used is a dry chemical etchant. For example, the first etchant is based on chlorine. The first etchant may etch directional or non-directional.

However, the first etchant preferably not only attacks the photoresist layer, but already etches through the contact layer, penetrates the output coupling layer and produces the output coupling structures.

According to at least one embodiment, the first etchant attacks the contact layer.

According to at least one embodiment, the first etchant is used until the contact layer in the output coupling section is removed.

According to at least one embodiment, a second etchant is used in step D) after the first etchant has partially or completely removed the photoresist layer in the output coupling section. The second etchant attacks the contact layer. The second etchant is used until the contact layer in the output coupling section is removed.

Even with the second etchant, the photoresist layer in the contact section is preferably not yet penetrated.

With the second etchant, for example, the output coupling structures are further formed or shaped. The second etchant is in particular a different etchant from the first etchant. For example, the second etchant is an isotropic etchant. For example, the second etchant may etch away the contact layer faster than the first etchant.

According to at least one embodiment, step F) is performed before step B). In step B), the photoresist layer is then applied to the contact element in the region of the contact section. The contact element is thus covered by the photoresist layer.

In the following, an optoelectronic semiconductor chip described herein and a method for producing an optoelectronic semiconductor chip described herein are explained in more detail with reference to drawings based on exemplary embodiments. Identical reference signs thereby specify identical elements in the individual figures. However, no references to scale are shown; rather, individual elements may be shown exaggeratedly large for better understanding.

DETAILED DESCRIPTION

Figure 1:
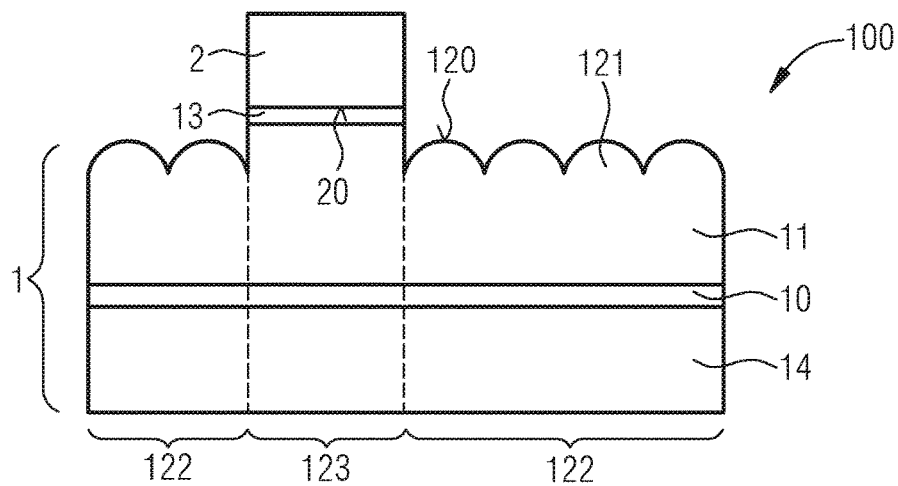
FIG. 1 a modification of an optoelectronic semiconductor chip.

FIG. 1 shows a modification of the optoelectronic semiconductor chip 100. The optoelectronic semiconductor chip 100 comprises a semiconductor layer sequence 1 with an active layer 10 for generating electromagnetic primary radiation, a current spreading layer 11, which in the present case is, for example, n-doped, and a p-doped semiconductor layer 14. The current spreading layer 11 also serves as an output coupling layer and is provided with output coupling structures 121 on an exit side 120 remote from the active layer 10. The semiconductor layer sequence 1 is based on AlInGaP, for example. The current spreading layer 11 comprises, for example, a doping concentration of at least $5 \cdot 10^{18}$ $cm^{-3}$. The dopant in the current spreading layer 11 is, for example, Si or Te.

The semiconductor layer sequence 1 is divided in the lateral direction into a contact section 123 and one or more output coupling sections 122. In the contact section 123, the exit side 120 is planar within the manufacturing tolerance. The output coupling structures 121 are provided only in the output coupling section 122.

In the contact section 123, a contact element 2 is arranged on the exit side 120. The contact element 2 comprises a bottom surface 20 which is substantially parallel to the active layer 10, and is in direct contact with the semiconductor material of the semiconductor layer sequence 1. Electrons are injected into the current spreading layer 11 via the contact element 2, for example. The contact element 2 is metallic, for example.

To reduce the contact resistance between the contact element 2 and the current spreading layer 11, a contact layer 13 is provided between the contact element 2 and the current spreading layer 11. The contact layer 13 comprises, for example, at least twice as high a doping concentration as the current spreading layer 11, but is substantially thinner. The area of the contact layer 13 corresponds substantially to the area of the bottom surface 20 of the contact element 2.

In the intended operation of the semiconductor chip 100 of FIG. 1, primary radiation is generated in the active layer 10. The primary radiation is coupled out via the exit side 120 with the aid of the output coupling structures 121. In particular, due to the high doping of the current spreading layer 11 and the associated high doping in the output coupling structures 121, there is increased absorption of the primary radiation within the output coupling structures 121, which reduces the efficiency of the semiconductor chip 100.

Figure 2:
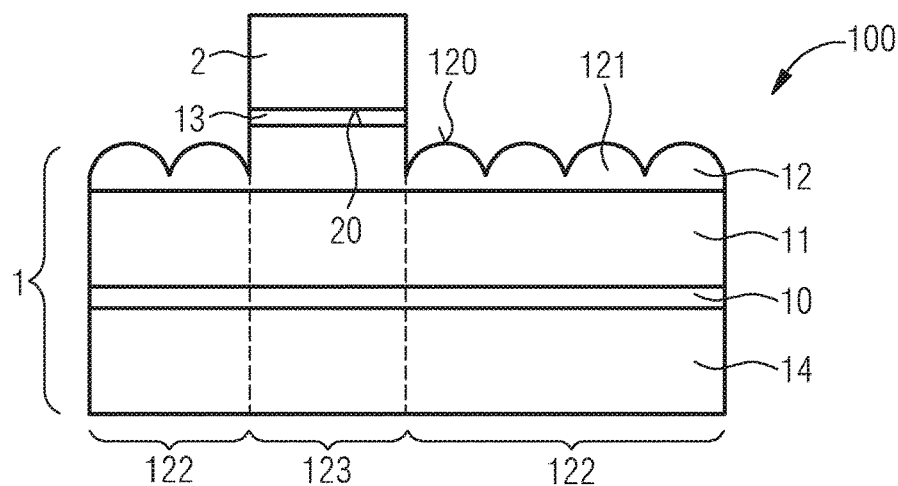
FIGS. 2 to 5 different exemplary embodiments of the optoelectronic semiconductor chip in cross-sectional view, FIGS. 6A to 8D various positions in different exemplary embodiments of the method for producing an optoelectronic semiconductor chip, FIG. 9A a photograph of an output coupling layer as produced by the method, FIG. 9B a top view of an exemplary embodiment of the optoelectronic semiconductor chip.

FIG. 2 shows a first exemplary embodiment of the optoelectronic semiconductor chip 100. The structure of the semiconductor chip 100 is essentially the same as the structure of the semiconductor chip 100 of FIG. 1. However, unlike in FIG. 1, the current spreading layer 11 is now not structured. Rather, an output coupling layer 12 is provided on the side facing away from the active layer 10. The output coupling layer 12 now comprises the exit side 120 with the output coupling structures 121. The output coupling layer 12 is a semiconductor layer of the semiconductor layer sequence 1. However, the output coupling layer 12 is selected such that it comprises a lower absorption coefficient for the primary radiation of the active layer 10 than the current spreading layer 11. Thus, there is less absorption loss in the output coupling structures 121.

To ensure a lower absorption coefficient in the output coupling layer 12, the output coupling layer 12 can, for example, be less heavily doped than the current spreading layer 11. However, in the present case, a light doping, for example of at least $1 \cdot 10^{17}$ cm$^{-3}$, is advantageous to enable transport of electrons from the contact element 2 to the current spreading layer 11 through the output coupling layer 12.

Furthermore, to achieve a low absorption coefficient in the output coupling layer 12, the output coupling layer 12 may be grown with a lower defect density than the current spreading layer 11. Also, it is possible that a composition whose band gap is larger than the energy of the primary radiation is chosen for the output coupling layer 12.

Figure 3:
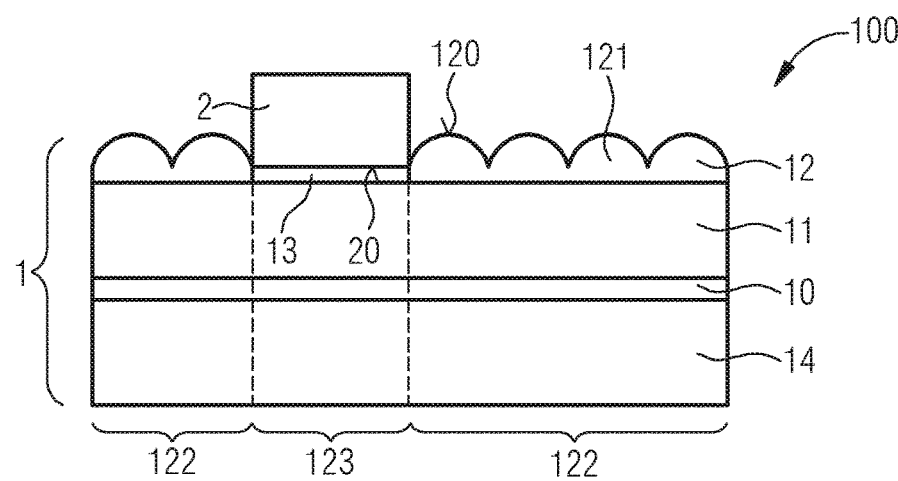

In FIG. 3, a second exemplary embodiment of the optoelectronic semiconductor chip 100 is shown. Unlike in FIG. 2, the contact element 2 is now not attached to the exit side 120, but penetrates the output coupling layer 12 starting from the exit side 120. The contact element 2 adjoins the contact layer 13 with its bottom surface 20. The contact layer 13 in turn adjoins the current spreading layer 11.

Figure 4:
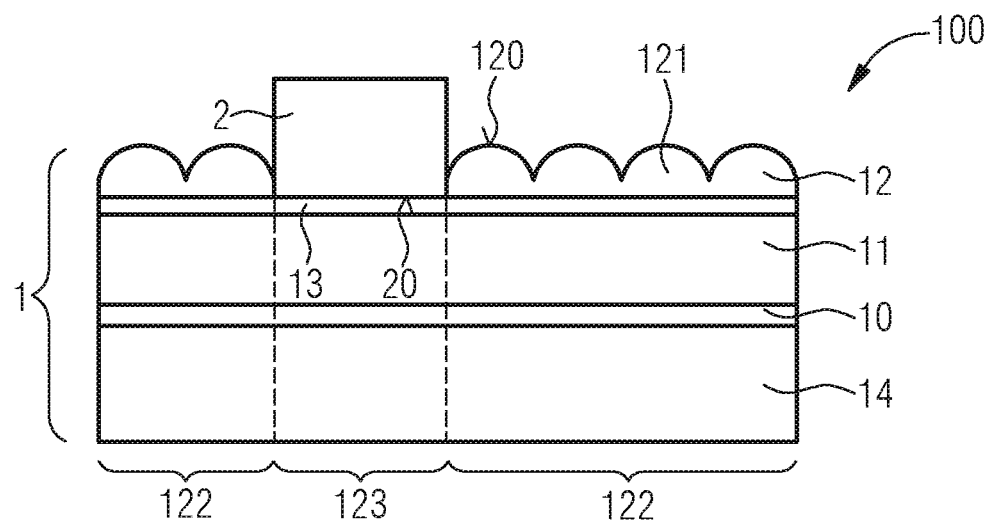

In the third exemplary embodiment of the optoelectronic semiconductor chip 100 shown in FIG. 4, unlike in FIG. 3, the contact layer 13 is not limited to the lateral extent of the contact element 2. Rather, the contact layer 13 extends over the entire lateral extent of the semiconductor chip.

Figure 5:
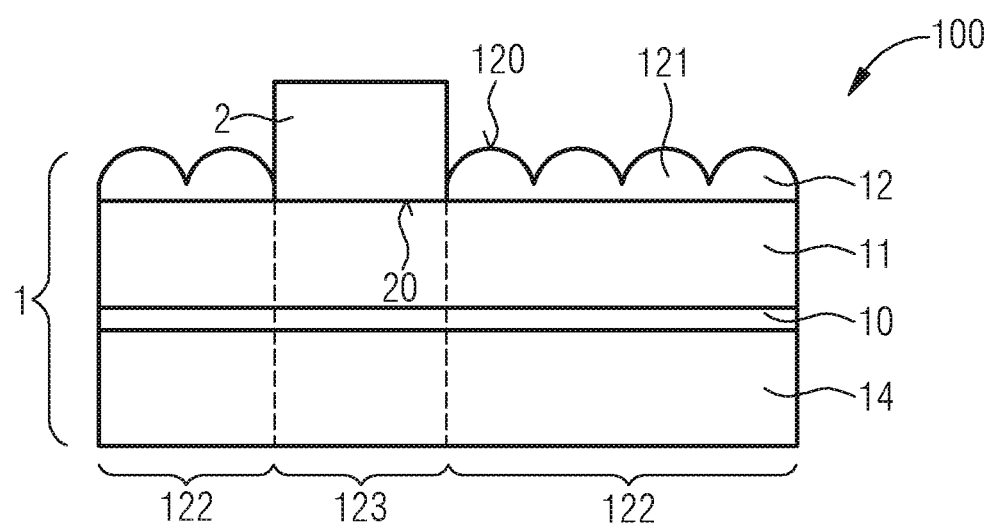

In the fourth exemplary embodiment of FIG. 5, a contact layer 13 is omitted. The contact element 2 is directly adjacent to the current spreading layer 11.

Figure 6A:
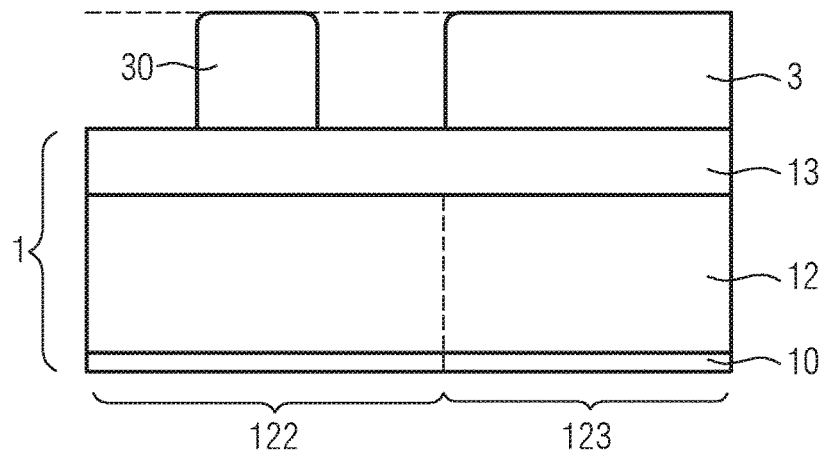

In FIG. 6A, a first position in a first exemplary embodiment of the method for producing an optoelectronic semiconductor chip is shown. Here, a semiconductor layer sequence 1 comprising an active layer 10, an output coupling layer 12 and a contact layer 13 is provided. The contact layer 13 is highly doped. The output coupling layer 12 is less heavily doped. Other than shown, a current spreading layer may be disposed between the output coupling layer 12 and the active layer 10. The semiconductor layer sequence 1 is based on AlInGaP, for example.

A photoresist layer 3 is deposited on the contact layer 13. The photoresist layer 3 is patterned and partially removed in an output coupling section 122. As a result, islands 30 of photoresist are left standing. Between the islands 30, the contact layer 13 is exposed.

In contrast, in a contact section 123 arranged laterally adjacent to the output coupling section 122, the photoresist layer 3 extends without interruption.

Figure 6B:
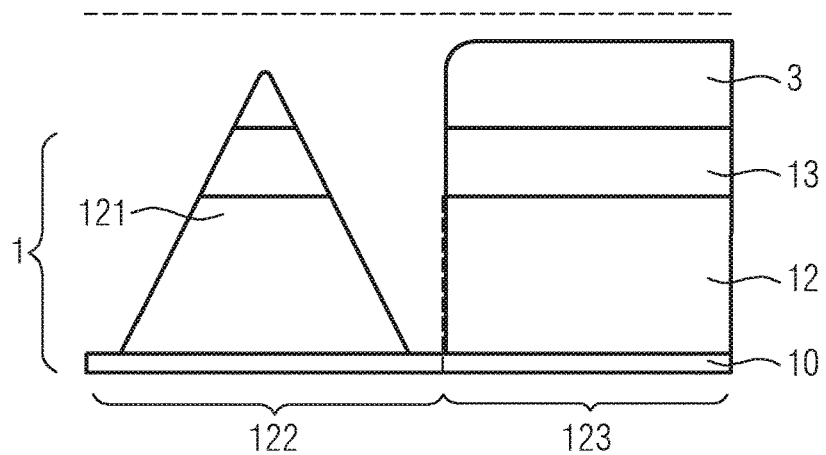

In FIG. 6B, a second position of the method is shown in which a first etchant is used to etch through the contact layer 13 in regions where the photoresist layer 2 has been removed. The first etchant has also penetrated and etched into the output coupling layer 12. As a result, output coupling structures 121 have been formed in the output coupling layer 12. In the present case, these output coupling structures 121 have a truncated pyramid shape.

The first etchant is, for example, a chlorine-based dry chemical etchant. The first etchant etches anisotropically, for example.

Unlike shown in the figures, the output coupling layer 12 is preferably not etched through completely. That is, even after the etching process, the output coupling layer 12 is preferably simply connected.

Figure 6C:
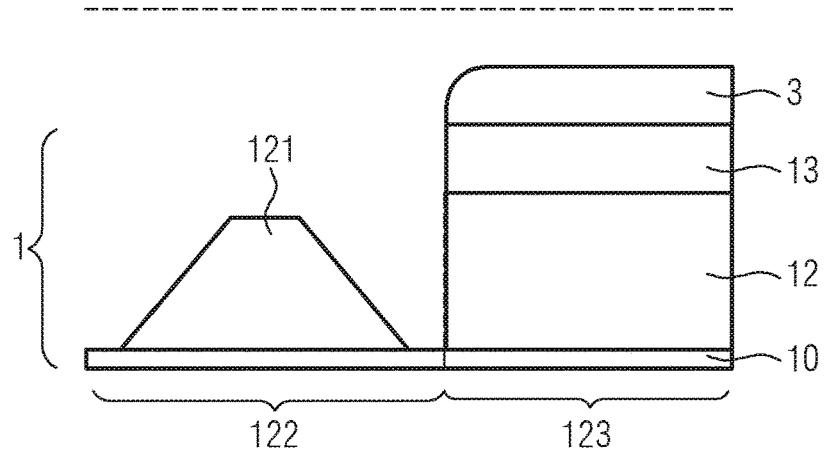

In FIG. 6C, a third position of the method is shown. The first etchant has been used until the contact layer 13 and the photoresist layer 3 in the output coupling section 122 are completely removed. The remaining output coupling structures 121 consist exclusively of the output coupling layer 12.

In the contact section 123, however, the semiconductor layer sequence 1 is still completely covered by the photoresist layer 3. Accordingly, the contact layer 13 is also still present.

By removing the photoresist layer 3 in the contact section 123 and applying a contact element to the exposed contact layer 13, the semiconductor layer sequence 1 can be electrically contacted.

Figure 7A:
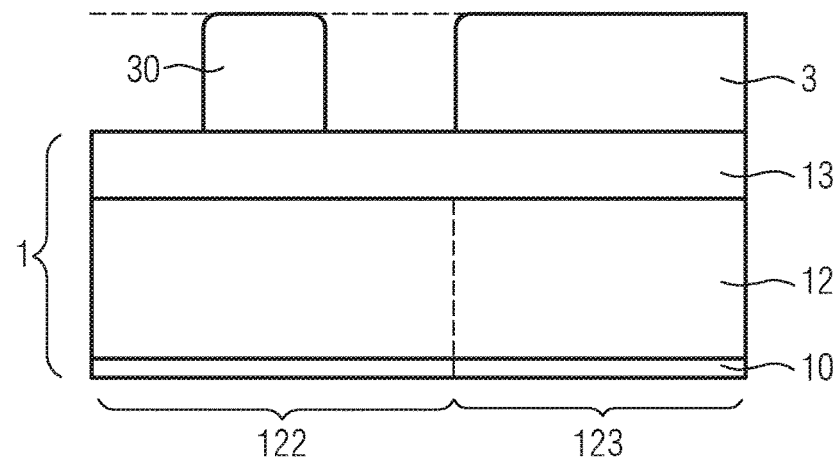

In FIG. 7A, a first position in a second exemplary embodiment of the method is shown. The position of the FIG. 7A corresponds to the position of the FIG. 6A.

Figure 7B:
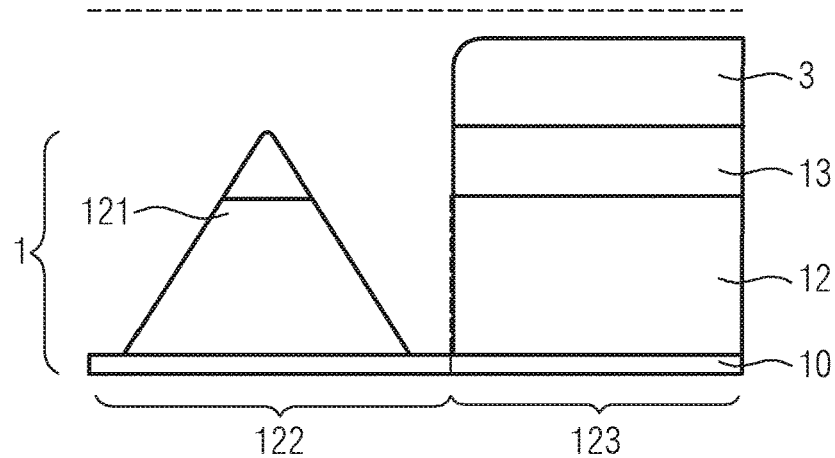

In FIG. 7B, a second position is shown in which etching has been performed with a first etchant until the photoresist layer 3 in the output coupling section 122 is removed. Again, output coupling structures 121 have been formed due to the islands from the photoresist layer 3. In contrast, the photoresist layer 3 in the contact section 123 is not completely penetrated, which is partly due to the fact that the photoresist layer 3 in the contact section 123 has not been patterned.

Figure 7C:
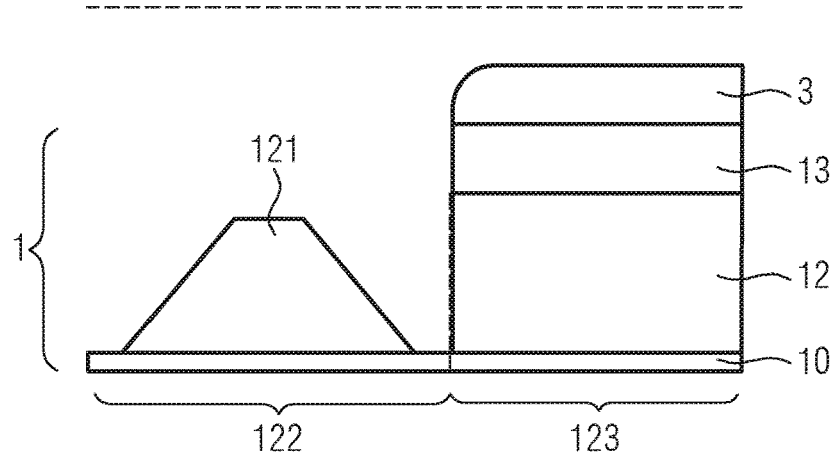

In FIG. 7C, a third position of the method is shown. Using a second etchant different from the first etchant, the semiconductor layer sequence 1 was further etched. Thereby, the contact layer 13 in the output coupling section 122 was removed. What remains are again output coupling structures 121 consisting exclusively of the output coupling layer 12.

The second etchant may, for example, be an isotropic etchant.

FIGS. 8A to 8D show a third exemplary embodiment of the method. The positions shown in FIGS. 8A and 8B correspond to the positions shown in FIGS. 6A and 6B. Thus, again, output coupling structures 121 have been formed in the output coupling section 122 by means of a first etchant. With the first etchant, the photoresist layer 3 and the contact layer 13 in the output coupling section 122 have not been completely removed.

Figure 8A:
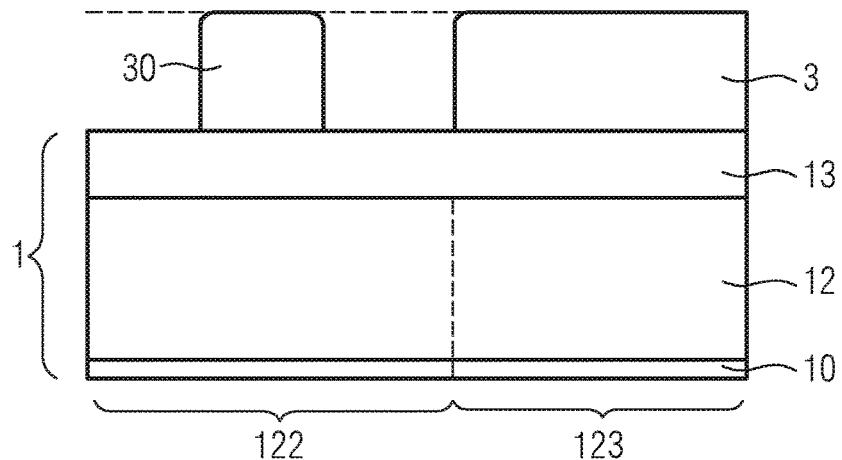
Figure 8B:
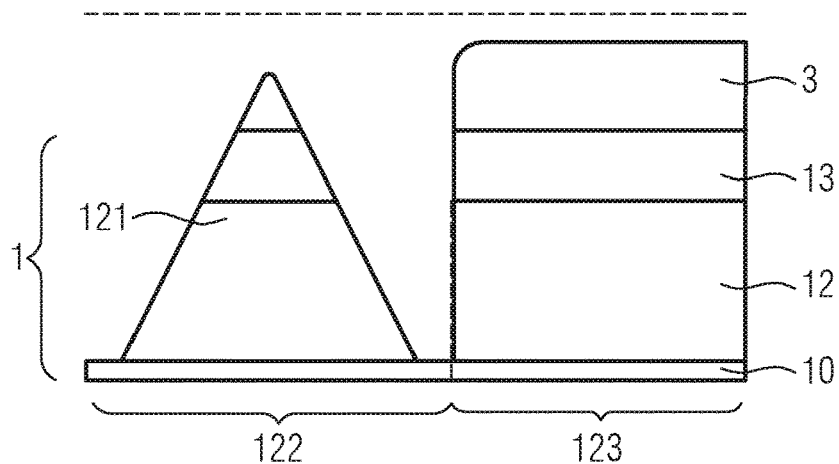
Figure 8C:
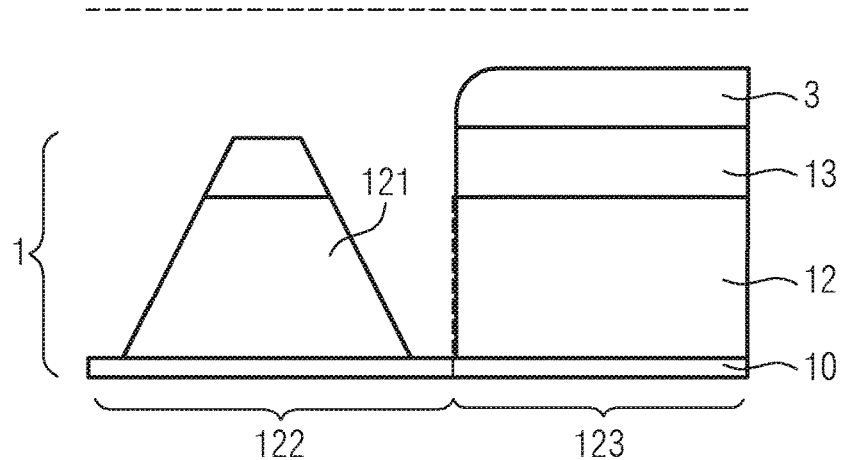

In FIG. 8C, a position is shown in which the photoresist layer 3 in the output coupling section 122 is completely removed with the help of, for example, an oxygen plasma. In the contact section 123, however, the photoresist layer 3 is not completely removed, which is again due to the smaller attack surface in the contact section 123.

Figure 8D:
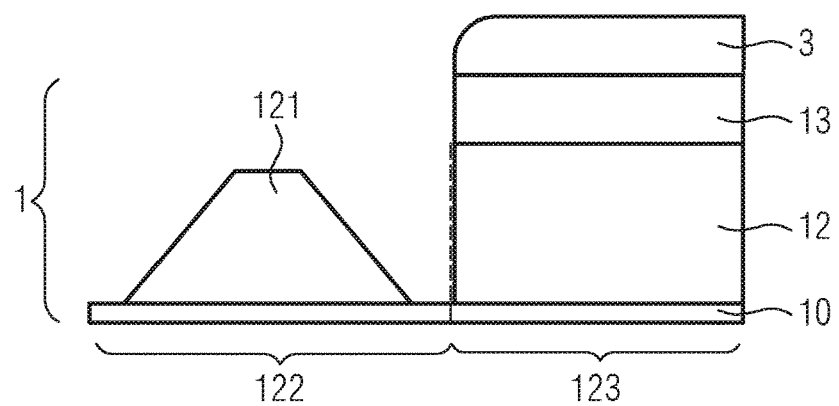

In FIG. 8D, a position is shown in which the contact layer 13 in the output coupling section 122 is then also removed, for example by means of a second etchant different from the first etchant.

Figure 9A:
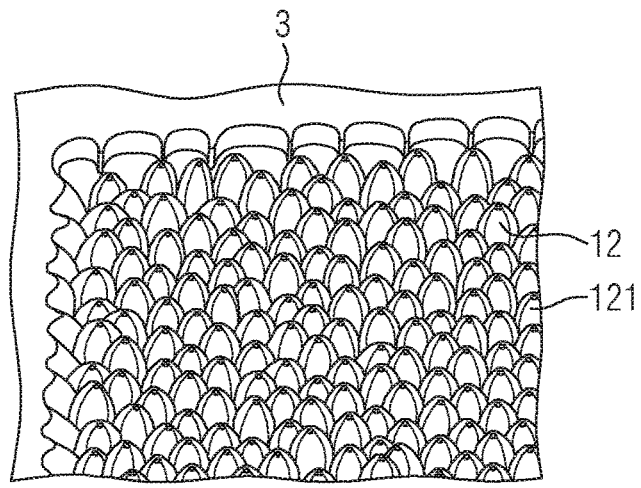

FIG. 9A shows a photograph of an output coupling layer 12 after it has been patterned by the method described herein. The resulting output coupling structures 121 are cone-shaped. The photoresist layer 3 is still present around the patterned region. In particular, a photograph of the method is shown here between steps D) and E).

Figure 9B:
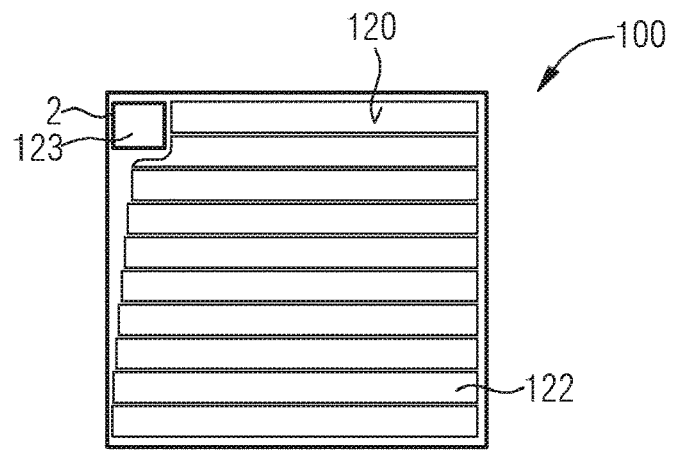

In FIG. 9B, the completed semiconductor chip 100 is shown in a top view of the exit side 120. The patterned output coupling section 122 and the smaller contact section 123 with the contact element 2 can be seen.

The invention is not limited by the exemplary embodiments based on the description thereof. Rather, the invention encompasses any new feature as well as any combination of features, which in particular includes any combination of features in the patent claims, even if these features or this combination itself is not explicitly specified in the patent claims or exemplary embodiments.

The invention claimed is:

1. An optoelectronic semiconductor chip comprising:
a semiconductor layer sequence having an active layer, a doped current spreading layer and an output coupling layer, which are arranged one above the other in this order;
a contact element, and
a doped contact layer, wherein
the active layer generates primary radiation in the intended operation,
the current spreading layer comprises a larger lateral electrical conductivity than the output coupling layer,
the output coupling layer comprises output coupling structures for radiation output on an exit side facing away from the active layer,
the output coupling layer comprises a lower absorption coefficient for the primary radiation than the current spreading layer,
the contact element is configured for injecting first charge carriers into the current spreading layer and comprises a bottom surface adjacent to a semiconductor material of the semiconductor layer sequence,
the doped contact layer is thinner than the current spreading layer and comprises a higher doping than the current spreading layer, and
the doped contact layer is adjacent to the bottom surface of the contact element.

2. The optoelectronic semiconductor chip according to claim 1,
wherein the exit side of the output coupling layer comprises a roughness of at least 200 nm.

3. The optoelectronic semiconductor chip according to claim 1, wherein
the output coupling layer comprises a lower defect density than the current spreading layer and/or
the band gap of the output coupling layer is larger than the energy of the primary radiation.

4. The optoelectronic semiconductor chip according to claim 1, wherein
the semiconductor layer sequence is based on $Al_nIn_{1-n-m}Ga_mP$ with $0 \le n \le 1$, $0 \le m \le 1$ and $m+n \le 1$,
the current spreading layer comprises a larger Ga content than the output coupling layer.

5. The optoelectronic semiconductor chip according to claim 1,
wherein the contact layer is arranged on the exit side of the output coupling layer and is adjacent to the exit side.

6. The optoelectronic semiconductor chip according to claim 1, wherein,
a lateral extent of the contact layer substantially corresponds to the lateral extent of the bottom surface of the contact element,
the lateral extent of the bottom surface is at most 25% of the lateral extent of the active layer.

7. The optoelectronic semiconductor chip according to claim 1,
wherein the contact layer is disposed between the current spreading layer and the exit side and is adjacent to the current spreading layer.

8. The optoelectronic semiconductor chip according to claim 1,
wherein the bottom surface of the contact element is directly adjacent to the current spreading layer.

9. The optoelectronic semiconductor chip according to claim 1,
wherein the output coupling layer comprises a lower doping than the current spreading layer.

10. The optoelectronic semiconductor chip according to claim 1,
wherein the output coupling layer is nominally undoped.

11. A method for producing an optoelectronic semiconductor chip comprising:
A) providing a semiconductor layer sequence having a doped contact layer, a less heavily doped output coupling layer and an active layer, which are arranged one above the other in this order, wherein the active layer generates primary radiation in the intended operation;
B) applying a photoresist layer to the side of the contact layer facing away from the active layer, wherein the photoresist layer completely covers the contact layer both in an output coupling section and in a contact section of the semiconductor layer sequence;
C) patterning and partially removing the photoresist layer in the output coupling section;
D) carrying out an etching process with which
etching completely through the contact layer and into the output coupling layer is carried out in the regions of the output coupling section in which the photoresist layer has been removed, thereby forming output coupling structures in the output coupling layer;
the contact layer in the output coupling section is removed,
the photoresist layer is not penetrated in the region of the contact section;
E) removing the photoresist layer in the region of the contact section; and
F) applying a contact element to the contact layer in the region of the contact section.

12. The method according to claim 11,
wherein in step D) a first etchant is first used which attacks the material of the photoresist layer and partially or completely removes the photoresist layer in the output coupling section.

13. The method according to claim 12, wherein
the first etchant attacks the contact layer,
the first etchant is used until the contact layer in the output coupling section is completely removed.

14. The method according to claim 12, wherein
in step D) a second etchant is used after the first etchant has partially or completely removed the photoresist layer in the region of the output coupling section, wherein
the second etchant attacks the contact layer,
the second etchant is used until the contact layer in the output coupling section is removed.

15. The method according to claim 11, wherein
the step F) is carried out before the step B) and
in step B) the photoresist layer is applied to the contact element in the region of the contact section.

* * * * *